(12) United States Patent
Jurgensen et al.

(10) Patent No.: US 6,261,406 B1
(45) Date of Patent: Jul. 17, 2001

(54) CONFINEMENT DEVICE FOR USE IN DRY ETCHING OF SUBSTRATE SURFACE AND METHOD OF DRY ETCHING A WAFER SURFACE

(75) Inventors: Charles W. Jurgensen; Gregory A. Johnson; Kunal N. Taravade, all of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/228,906

(22) Filed: Jan. 11, 1999

(51) Int. Cl.$^7$ .................................................. H01L 21/3065
(52) U.S. Cl. .......................................................... 156/345
(58) Field of Search ............................ 156/345; 118/720, 118/721, 504; 204/192.15, 298, 192.34, 298.11

(56) References Cited

U.S. PATENT DOCUMENTS

| | | | |
|---|---|---|---|
| 4,535,835 | * 8/1985 | Holden | 165/134 |
| 4,661,203 | * 4/1987 | Smith et al. | 438/725 |
| 4,764,249 | * 8/1988 | Gobrecht et al. | 257/630 |
| 4,812,201 | 3/1989 | Sakai et al. | 156/643 |
| 5,223,108 | * 6/1993 | Hurwitt | 204/192.12 |
| 5,246,526 | 9/1993 | Yamaguchi et al. | 156/345 |
| 5,271,798 | 12/1993 | Sandhu et al. | 156/638 |
| 5,372,674 | 12/1994 | Steinberg | 156/643 |
| 5,567,255 | 10/1996 | Steinberg | 156/345 |
| 5,627,105 | 5/1997 | Delfino et al. | 438/627 |

(List continued on next page.)

FOREIGN PATENT DOCUMENTS

407094492 * 4/1995 (JP).

OTHER PUBLICATIONS

Handbook of Plasma Proessing Technology; Stephen M. Rossnagel et al.; pp. 308–334, 1990.
Microelectronics: Processing and Device Design; Roy a. Colclaser; pp. 81–83, 1980.
Rie Operating Manual; Technics Series 800 Micro Reactive ion Etcher Microfabrication Facility; U.C. Davis; Version 2.3 No Date Available.

(List continued on next page.)

*Primary Examiner*—Gregory Mills

(57) ABSTRACT

A confinement device for operative arrangement within a substrate etching chamber, having a lower surface of the device generally arranged over a substrate outer top surface such that a gap-spacing therebetween is generally equidistant. This spacing is less than a sheath thickness for the plasma, preferably less than $\frac{1}{3}^{rd}$ of an inner width of an aperture through the lower surface of the device. The aperture, sized preferably greater than 3 times the sheath thickness, is in communication with a channel of the device in which an etchant gas can be confined for reaction to selectively etch a localized area in the substrate outer top surface generally below the aperture. A system for dry etching an IC wafer includes a substrate etching chamber and a confinement device. The etchant gas may be a plasma induced and sustained by RF energy, a microwave source, or other source, as designed. And, a method is included for selectively etching a localized area in a substrate outer top surface, having the steps of: arranging a lower surface of a confinement device over the outer top surface, leaving a spacing therebetween, so that an aperture through said lower surface is located generally above the localized area (the spacing may cover the whole of the outer top surface, an area on which microcircuits are fabricated, or some other portion of the outer top surface); and providing an etchant gas to a channel in the device that is in communication with the aperture.

26 Claims, 7 Drawing Sheets

U.S. PATENT DOCUMENTS

| | | | |
|---|---|---|---|
| 5,667,592 | 9/1997 | Boinott et al. | 118/719 |
| 5,693,234 | 12/1997 | Peters | 216/2 |
| 5,705,320 | 1/1998 | Hsu et al. | 430/313 |
| 5,750,012 | 5/1998 | Ireland et al. | 204/192.12 |
| 5,998,233 | * 12/1999 | Sugitani et al. | 438/52 |

OTHER PUBLICATIONS

Metal Etch MxP Centura Functional Description; Aplied Materials; Apr. 1995.

Helical Resonator; D.L. Smith, Thin–Film Deposition—Principles & Practice; 1995 p. 522.

Helicon Sources; F.F. Chen; Helicon Plasma Sources; 1995.

Plasma Physics; London Institute of Physics 1974; Institue of Physics Conference Series, No. 20. p. 131.

* cited by examiner

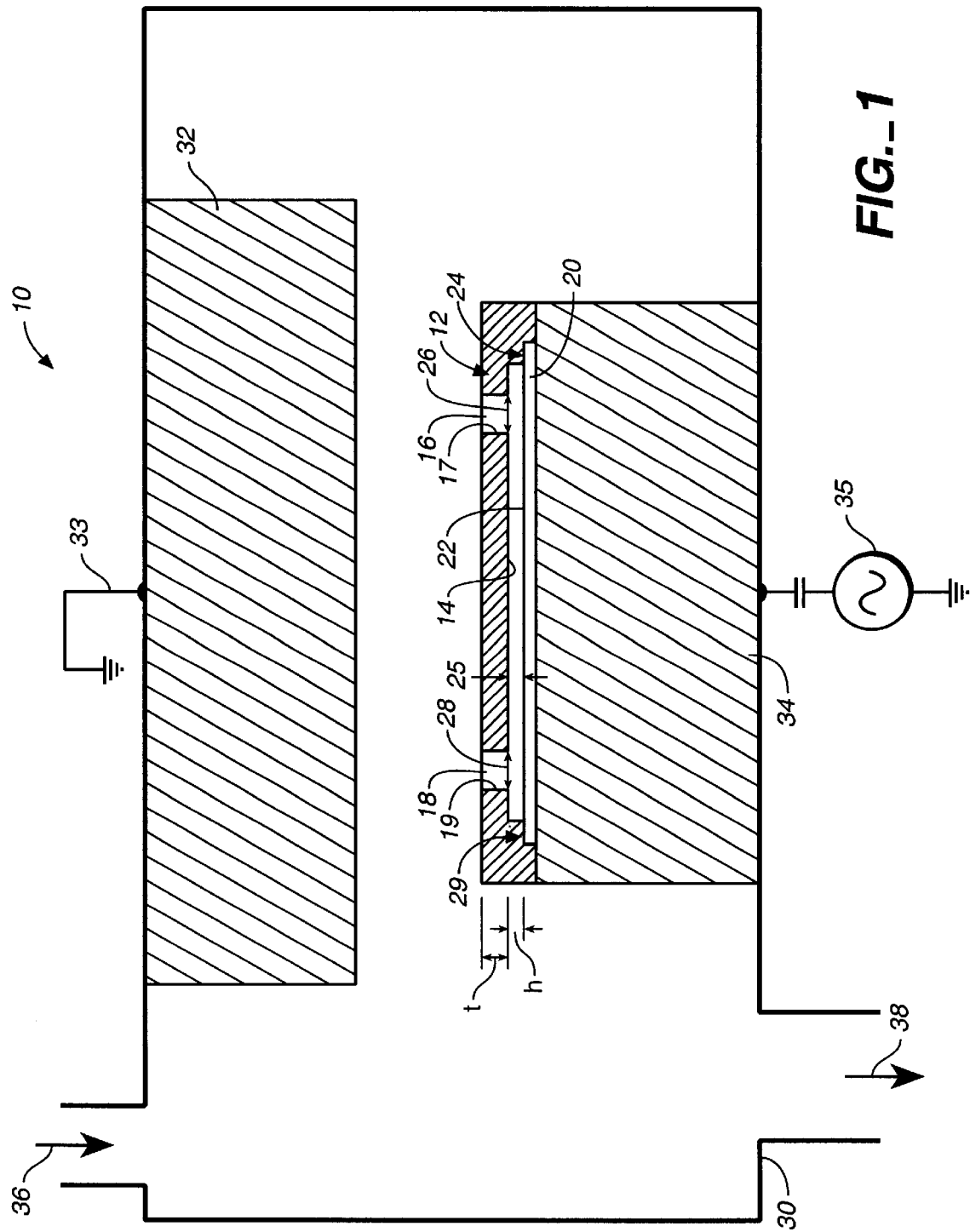

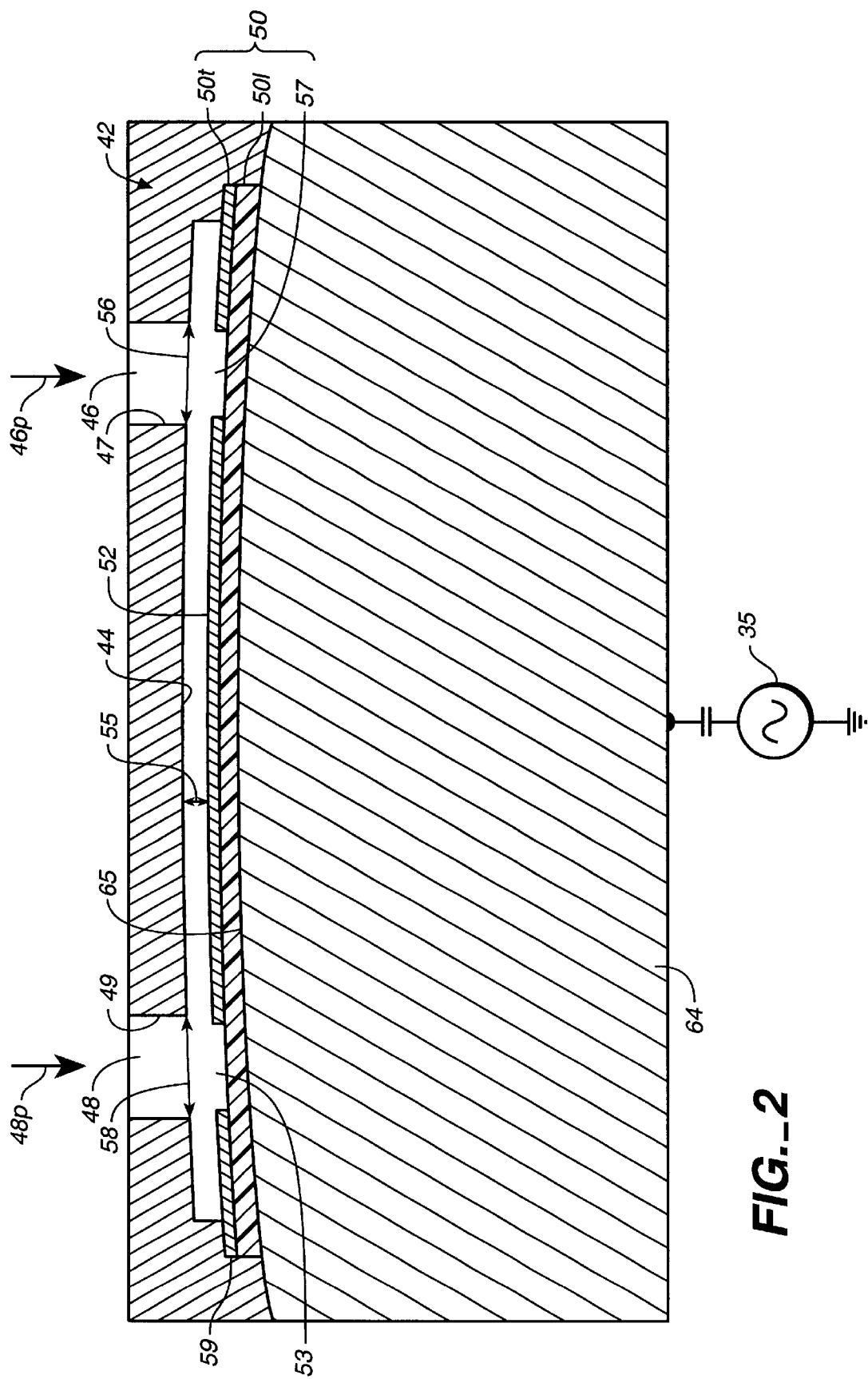
FIG._2

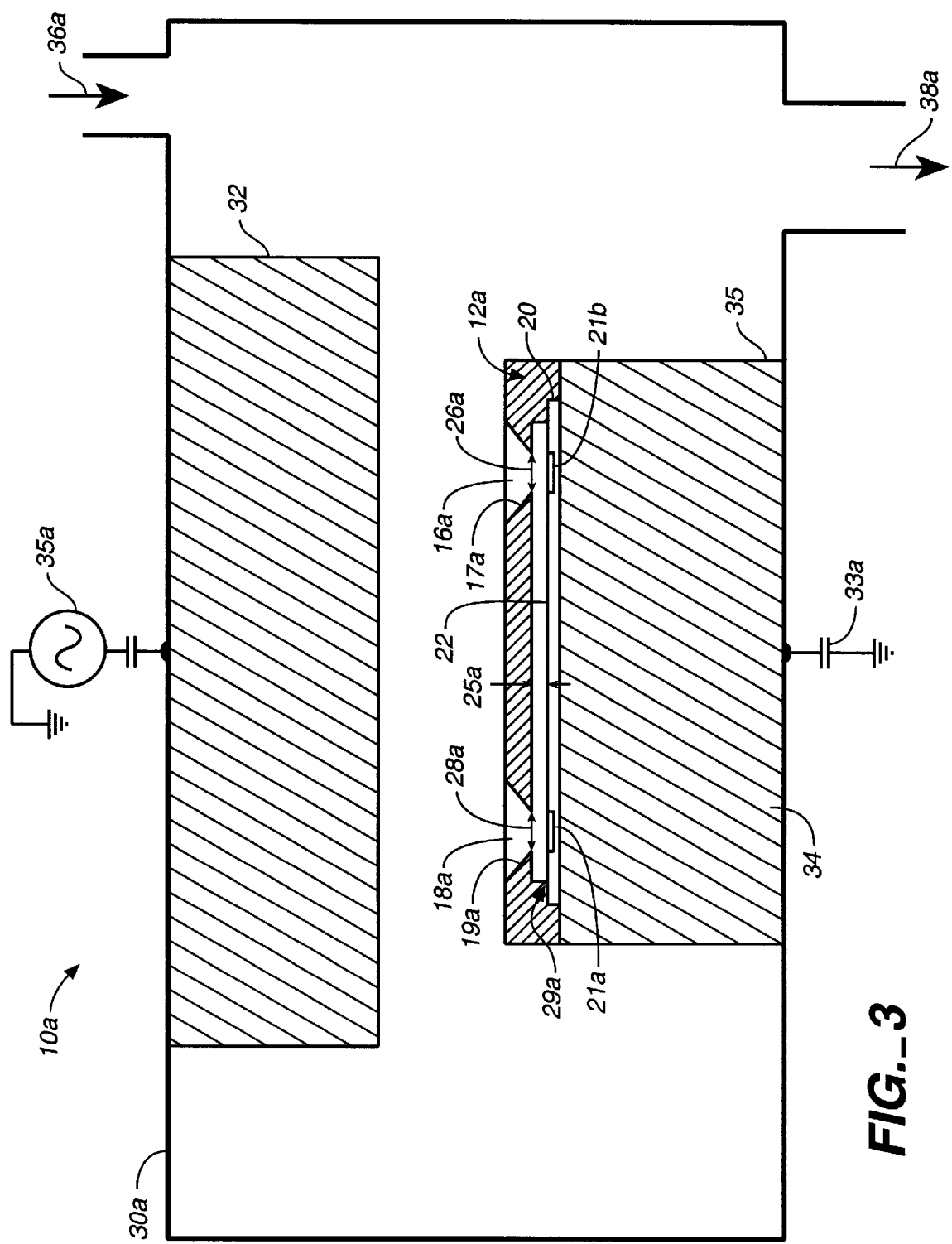
FIG._3

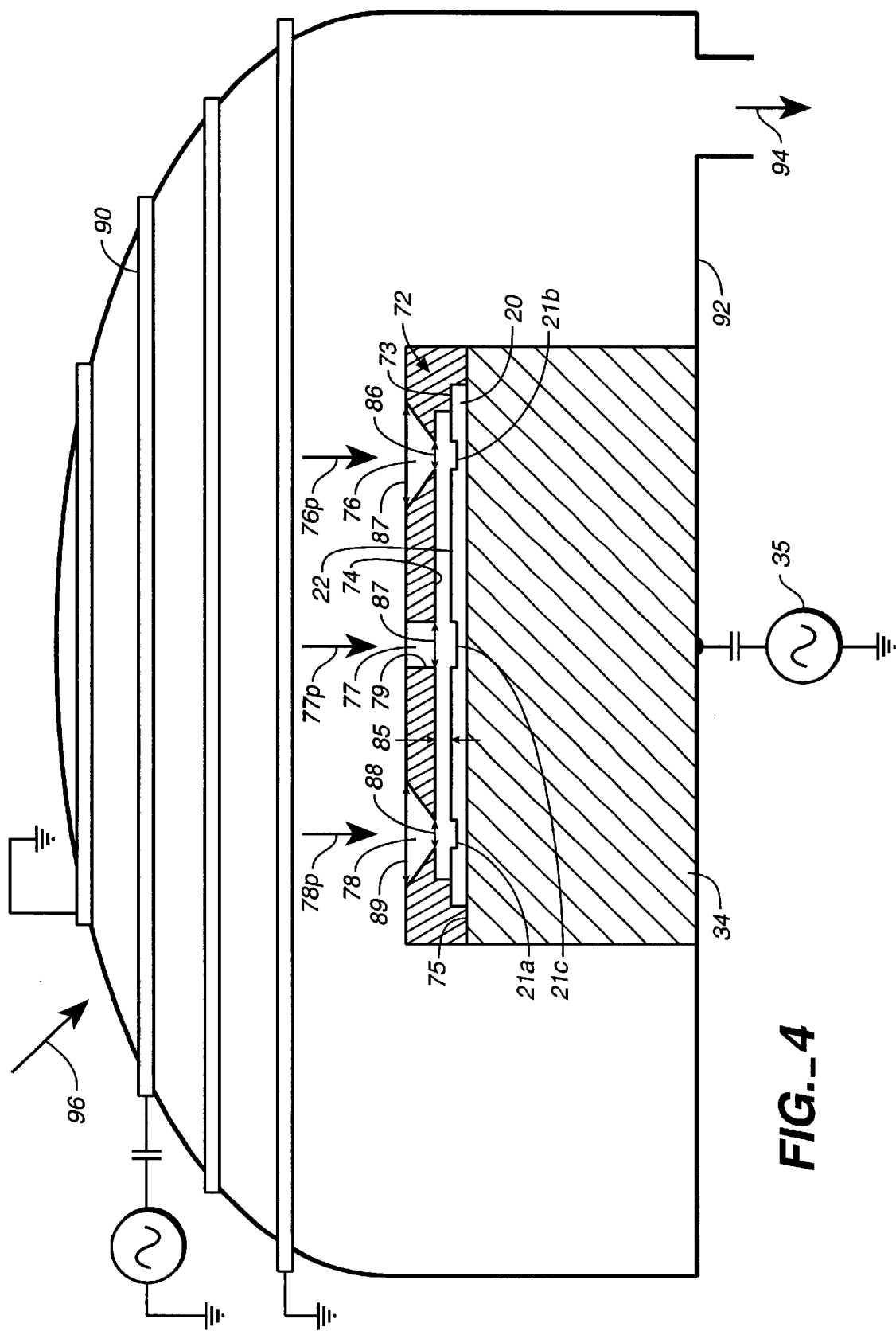
FIG._4

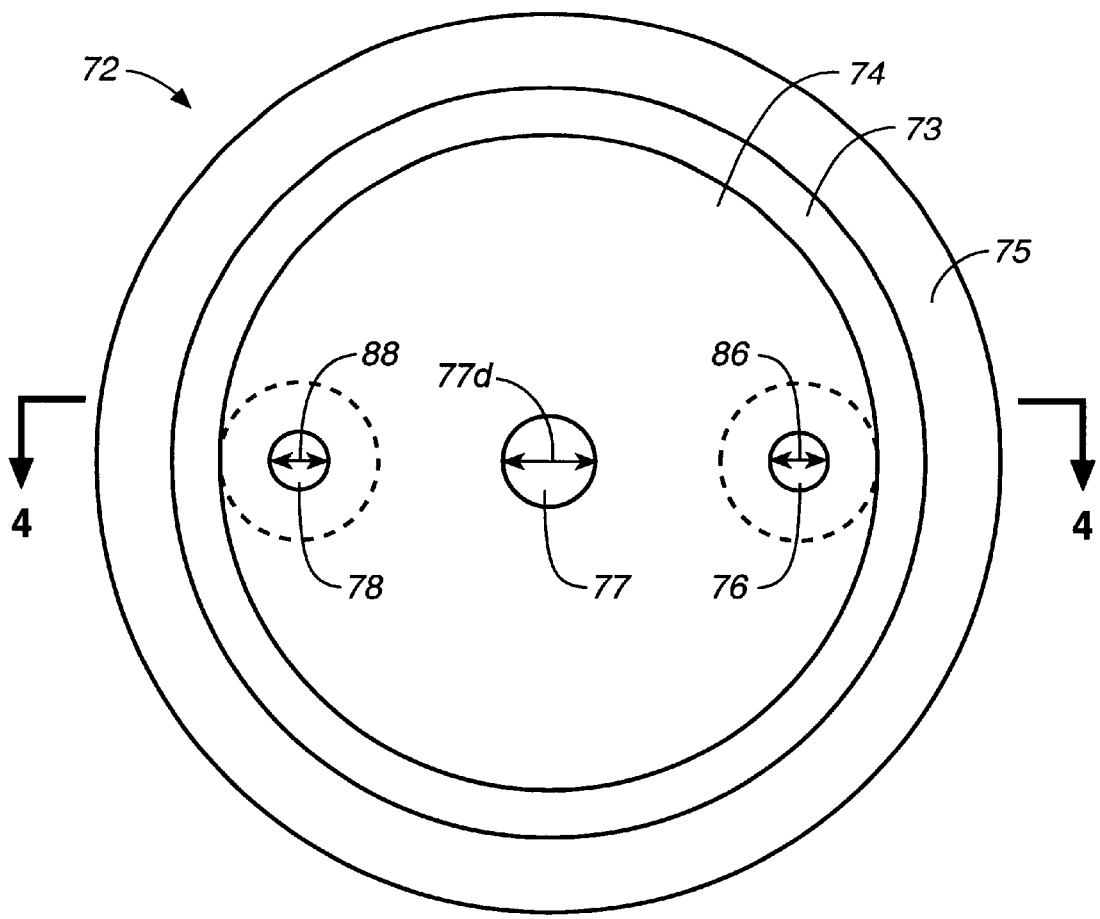
FIG._5

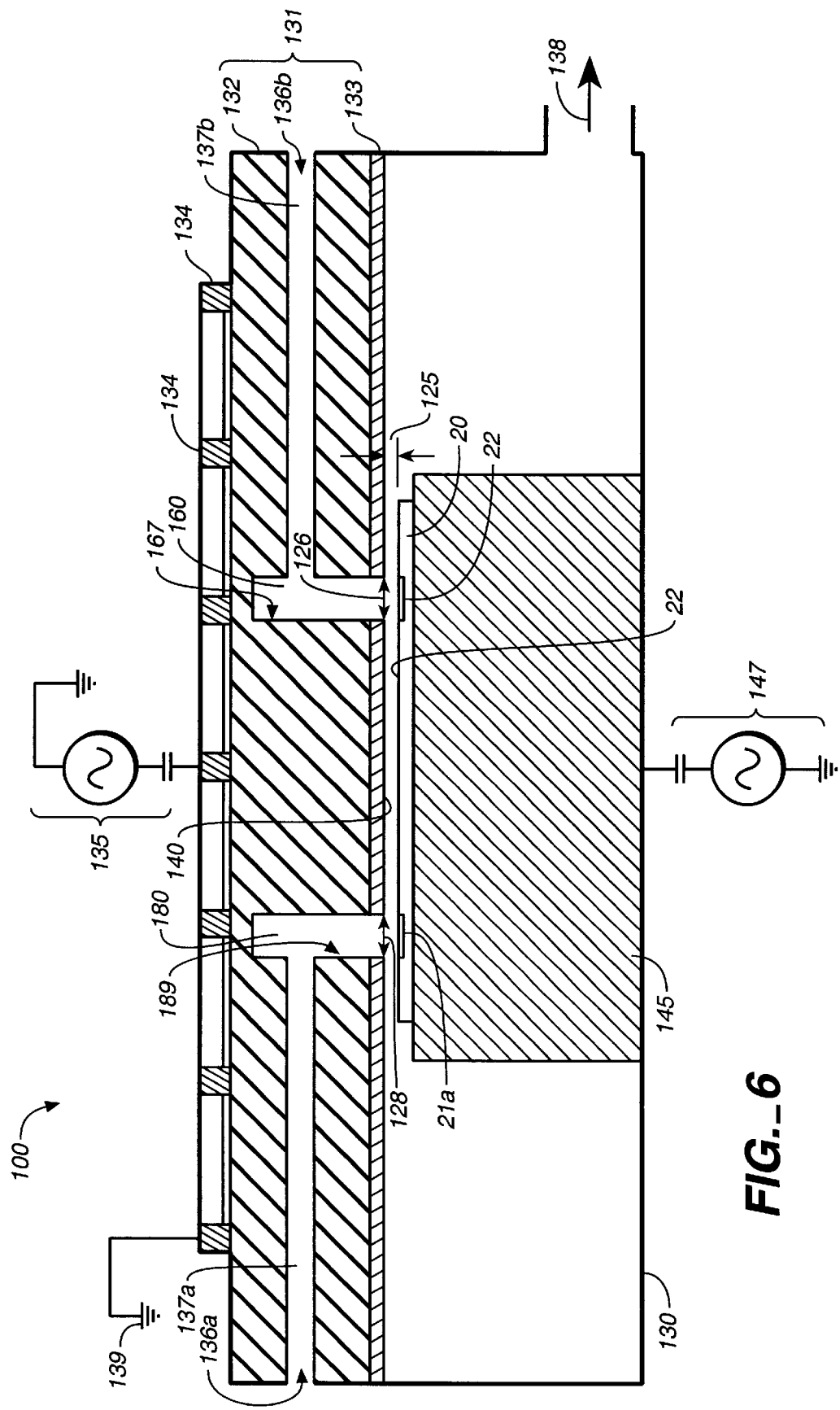
FIG._6

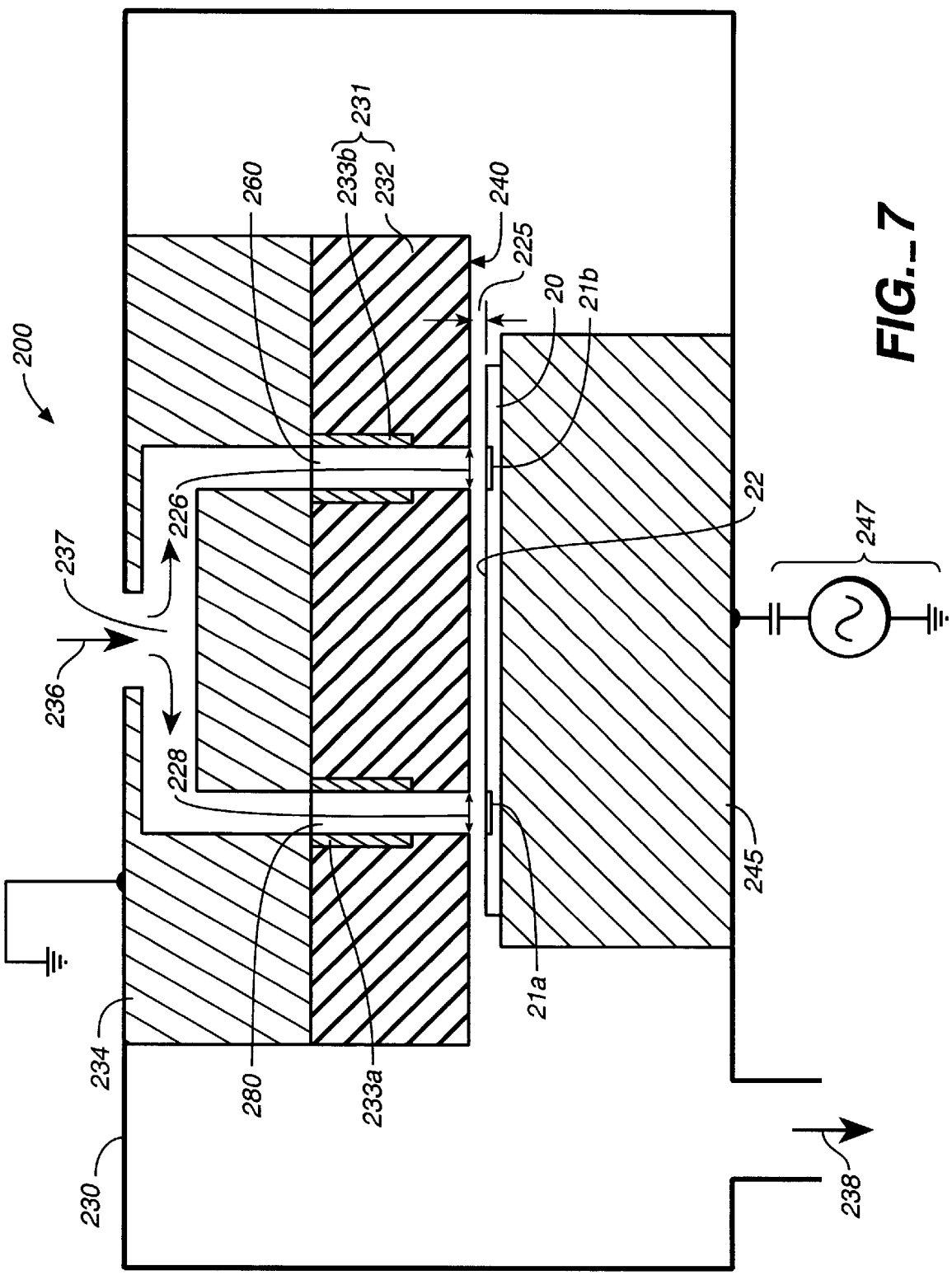
FIG._7

CONFINEMENT DEVICE FOR USE IN DRY ETCHING OF SUBSTRATE SURFACE AND METHOD OF DRY ETCHING A WAFER SURFACE

BACKGROUND OF THE INVENTION

In general, the present invention relates to devices and methods used in dry etching a surface of a wafer or substrate in semiconductor processing, and more particularly, to a novel dry etch confinement device that takes advantage of the so-called "hollow cathode effect" for operative arrangement within a substrate etching chamber apparatus that can be incorporated into an integrated cluster tool platform, if desired; and a novel method of dry etching a surface of a wafer substrate using such a confinement device with an etchant gas.

Microelectronics is that area of electronics technology associated with the fabrication of electronic systems or subsystems using extremely small (microcircuit) components. Since semiconductor fabrication and processing is driven by the computer- electronics industry, the demands for greater capability and faster data processing of smaller-sized computerized systems result in a demand for smaller-and-smaller integrated circuit (IC) microcircuits. Thus, precision IC processing is ever more important in microcircuit wafer fabrication.

The use of silicon and its oxide, along with photolithography, in semiconductor wafer fabrication dates back to the 1950's. The substrate for a microelectronic circuit is the base upon which the circuit is fabricated. A substrate must have sufficient mechanical strength to support its circuit(s) during fabrication, and substrate electrical characteristics depend on the type of microcircuit being fabricated. In general, hybrid microcircuits are deposited on substrates, and monolithic integrated circuits are formed within substrates. The substrates used in building hybrids are usually dielectric materials such as ceramics, glasses, or single-crystal insulators; and in some cases conductors or semiconductors coated with a dielectric layer are used. The substrates used for monolithic integrated circuits are semiconductor (e.g. silicon, GaAs) wafers (which can provide both electrical and mechanical-support functions) sliced from large single crystals, except in the case of special fabrication processes like silicon on sapphire.

Microcircuit wafer fabrication generally starts with a substrate to which layers, films, and coatings (such as photoresist) can be added or created (e.g., when fabricating a MOS monolithic IC, a silicon oxide layer is created on top of the silicon wafer), and from which these added or created materials can be subtractively etched (e.g., as in dry etching). Throughout semiconductor wafer fab, various processes are used to "clean" the wafers so that surfaces are reproducible and stable (see, generally, "Microelectronics: Processing and Device Design" by Prof. Roy A. Coclaser, John Wiley & Sons (1980), pg. 82).

More-particularly, in silicon wafer production, a well known process called chemical mechanical polishing (CMP) is widely being used to create a more planar outer top surface. Many integrated circuit fabrication modules introduce topographic non- planarity onto the wafers top surface. Examples include the formation of metal interconnect lines by metal deposition and patterning using photolithography and reactive ion etching. The subsequent dielectric deposition process preserves this non-planarity of the wafer top surface but this non-planarity is undesirable for subsequent photolithography patterning steps. To solve this problem, the deposited oxide thickness is increased compared to the desired final oxide thickness, and then this additional oxide is removed by CMP. In the case of oxide CMP, the wafer is polished using a colloidal suspension of fine $SiO_2$ particles in an aqueous, alkaline "polishing" solution. The mechanical component of the polishing process causes material to be removed more rapidly from the high spots of the wafer surface which reduces the amplitude of any surface topography.

In the case of patterning (photo and etch) after dielectric deposition, the requirement for simultaneously clearing the circuit areas and the alignment marks makes dielectric etching difficult. For example, in dielectric via etching, it is difficult to develop an optimized etch process that simultaneously clears the vias and the alignment marks without over or underetching either. Even if an optimized dielectric etch process could be developed, certain thicknesses of dielectric over the alignment marks may create undesirable interference effects, making their recognition by the stepper alignment system difficult. This may necessitate the use of an extra photo-etch step to clear the dielectric over the alignment marks before attempting the patterning of the circuit. Thus it is advantageous to remove dielectric from over the alignment marks. The confinement device and associated method for selectively etching of the invention eliminates the need for an extra patterning step by using a two step etch that, first, clears out the alignment mark(s) in an etching chamber incorporating the novel confinement device and, then, performs a standard via etch in a subsequent conventional etch chamber.

Although CMP has a desired surface-planarization benefit (whether it is for dielectric or metal uniformity upon which successive layers can be built), an undesirable and costly side-effect of using CMP is that alignment marks required for subsequent photolithography steps are also "planarized". When a subsequent metal layer is applied to the wafer above a planarized featureless surface, the alignment marks are no longer "visible" to the alignment sensors in the lithography tools, which require distinctive topography/contrast difference in the alignment mark scheme to operate. This is illustrated in FIGS. 2A–B, and associated background description in Column 2, of U.S. Pat. No. 5,705,320 issued to Hsu et al. which states that: "It is therefore essential that the IMD [inter-metal-dielectric layer 30] be cleared from the alignment mark areas and the metal layer from laser mark areas." Good definition of alignment marks is necessary for proper pattern alignment in subsequent wafer fabrication steps.

Currently, to clear-out alignment marks/recesses filled-in after a planarization process, such as CMP, IC manufacturers often use a series of additional costly (complex and time-consuming) photolithography steps: Applying a marker clear-out photo resist (or photosensitive coating that adheres to the outer surface of the wafer), exposing the resist to ultraviolet light, developing the resist pattern, then etching the mark or recess using a plasma etching (e.g. reactive ion etching (RIE)) process, and finally adding a resist ash and cleaning step. Since the CMP process can be used several times throughout the fabrication of a single semiconductor wafer, and an alignment mark clear- out step is generally required after each CMP step to provide "redefinition" to every mark that has lost its distinctive recessed-topography, a single wafer can undergo several additional time-consuming photolithography clear-out steps. Therefore, in wafer fabrication, it is very desirable to find an alternative to having to perform (costly) photolithography alignment mark clear-out steps. The instant invention does just that.

U.S. Pat. No. 5,271,798 issued to Sandhu et al. In 1993, describes "the selective etching of tungsten by locally removing the tungsten from the alignment marks [normally a few-hundred microns in size] through wet etching without the need for any photo steps. Either before tungsten CMP or after, the wafers are flat aligned and tungsten etch solution is introduced through an enclosed etchant dispensing apparatus . . . [see column 2, lines 18–25]." After the wet etch, the etching byproduct is removed by suction and the wafer is cleaned by being rinsed in distilled water. "Wet etching" uses liquids (which have safety hazards and liquid waste disposal problems) and has limited uses in wafer fabrication.

FIG. 3 of U.S. Pat. No. 5,705,320 to the Hsu et al., mentioned above, shows a reticle 50 for a stepper which contains an image of the pattern for integrated circuit contact openings in the area 52. Located in the frame area 54, is a window 56 with dimensions of 3.5 mm×1.6 mm (column 4, lines 39–44). This patent continues, in column 4 through column 5:

> The stepper senses the edges of the aligment marks 32 through the transparent insulative 30 and aligns the stage to position a first die in the focus of the reticle 50. After exposing the resist over the die to the contacts image, the stepper proceeds to expose the dice in a programmed sequence. When an alignment mark die 14 FIG. 1) is reached, the stepper exposes the resist over the 3.5 mm×3.5 mm alignment mark region 16 by making three successive overlapping exposures through the clear-out window 56. During these exposures, four programmable mask blades located within the stepper restrict the exposing radiation to pass only through the clear-out window 56 preventing exposure from other portions of the reticle 50.

Among other problems related with the Hsu et al. reticle 50 design and its associated process, neither are able to remove even a thin layer of tungsten within a recessed mark.

Therefore, a new useful "dry" process and apparatus is needed that is capable of clearing-out, or re-defining, alignment marks/recesses on the order of for example, 30 µm to 5 mm across (in size) and 0.5 µm to 3.0 µm deep, which have effectively lost their distinctive topography during some part of the wafer fabrication process (such as during CMP). Without reasonable and cost-effective solutions at hand for recapturing the definition of wafer alignment marks which have partially (or wholly) lost their distinctive shape/topography, it is difficult (if not impossible) for wafer positioning mechanisms to precisely align wafers during wafer fabrication. Without accurate, reproducible wafer alignment during fabrication, precise specifications of the desired microcircuits cannot be met.

Plasmas are highly ionized gases which contain a mixture of electrically charged and neutral particles, and therefore, conduct electricity and react collectively to electromagnetic forces. By definition, the electron plus negative ion charge density and positive ion charge density are generally equal in a plasma. Plasmas are highly conductive and thus are nearly equi-potential regions, and they are always bounded by positive space charge regions known as plasma sheaths where the majority of any potential drops imposed across the plasma will occur. The sheath thickness "S" is given by the following solution to Poisson's equation, J. E. Allen in *Plasma Physics*, Institute of Physics Conference Series 20 (London Institute of Physics, London, 1974), at p. 136:

$$S = \sqrt{\frac{\varepsilon_0 k T_e}{2 n_s q^2}} \int_1^{(q\Delta/kT_e)} \frac{dx}{\sqrt{\exp(-x) - 2 + \sqrt{1 + 2x}}} \quad \text{Equation [1]}$$

where the edge of the sheath on the plasma side is defined as the point where the electron density falls by 1/e relative to the plasma density at the point where quasineutrality breaks down ($\eta_s$). This definition of the sheath edge was chosen because the sheath potential approaches the potential at the plasma edge asymptotically. In equation [1], q is the electronic charge, $\epsilon_0$ is the permittivity of free space, k is the Boltzmann constant, $T_e$ is the electron temperature, and $\Delta$ is the voltage drop across the sheath. This equation was derived for a DC sheath, but it approximately applies to an RF sheath if we understand S to be the time averaged thickness and $\Delta$ to be the time averaged voltage drop across the sheath. For a typical processing plasma, the plasma density in the center of the plasma is $10^{10}$ to $5 \times 10^{11}$ cm$^{-3}$ which corresponds to an edge of plasma density of $\eta_s = 4 \times 10^9$ to $2 \times 10^{11}$ cm$^{-3}$. Typical electron temperature is 5 eV, and typical sheath voltage drops for RF biased sheaths over a range from about 50 to 500 V. Substituting these numbers into equation [1] yields typical sheath thickness of 0.025 to 1 cm, increasing as the voltage drop imposed across the sheath increases or the plasma density decreases.

In general, an electrode in contact with a plasma is referred to as a cathode whenever a large DC or RF voltage drop is imposed across the sheath adjacent to that electrode. If a cathode contains an aperture with a depth and diameter on the order of a few sheath thicknesses, then an intense plasma known as a hollow cathode discharge will form within and above the aperture because secondary and/or RF excited electrons are concentrated and confined in a small region. Additional background information on the so-called "hollow cathode effect", can be found in Chapter 12 (pages 308–335 incorporated herein by reference) of the *Handbook of Plasma Processing Technology*, edited by Stephen M. Rossnagel, Jerome J. Cuomo, and William D. Westwood (Noyes Publications, NJ, 1990), see particularly section 12.2.2 (page 311 where "sheath" is mentioned) entitled "Hollow Cathode". FIGS. 3 and 4 on pages 311 and 312 of this *Handbook* are schematics of a simple hollow cathode, "formed by confining a diode target with a similar opposing diode target." FIG. 8 on page 314 of this *Handbook* is a schematic of a "super-confined hollow cathode". Nowhere does the *Handbook* suggest suitability of the simplified cathode configurations for large-scale wafer production.

Currently-available dry etch plasma systems typically flow reactant gases into a vacuum chamber and apply an electric field at radio or microwave frequencies to electrodes to ionize the reactant gases and generate a plasma. Plasma reactants/radicals etch the substrate material intended to be removed. The electric energy applied to the supply gas entering a vacuum etching chamber may be from a capacitively coupled radio-frequency (RF) electrode, an inductively coupled RF source, a microwave generator (such as is used in electron cyclotron resonance (ECR) chambers), or other field generating source. Many types of plasma reactors currently exist: tunnel or barrel reactor; flat reactor (e.g., a pair of parallel electrode-plates); waveguide reactor (e.g., a downstream microwave generator); and so on. Relative to the mass of other particles within an etchant gas, electrons have a small mass and tend to absorb most of the energy gained from the electromagnetic field source. These high energy electrons collide with other particles, ionizing the etchant gas to sustain the plasma. Plasmas have been adapted for wide use in semiconductor wafer fabrication. For purposes of discussion, the wafer fab process referred to as "dry etching" has been classified into three subcategories of etching systems: (1) glow discharge methods (including "plasma etching" with low energy ion bombardment, Reactive Ion Etching, "RIE", and glow discharge sputter etching which uses an inert gas plasma); (2) ion beam systems (including "ion milling", chemical assisted ion milling, and reactive ion beam etching); and (3) down stream plasma etching where a plasma is used to generate radicals but where the substrate is not exposed to the plasma.

Capacitively coupled plasma discharges (characterized by relatively low ion densities) are widely used in integrated circuit manufacturing. RIE incorporates high RF power and high ion energy to attain fast etch rates. One current use of RIE is to etch vias into IC wafer layers. However, problems encountered in the current RIE systems include etch-induced substrate damage and low selectivity (usually attributed to the high energy ions). More-recently, semiconductor fabrication has been moving toward the use of high density plasma (HDP) sources. In general, HDP sources are combined with capacitively coupled wafer electrodes to provide independent control of the ion flux and ion energy. The main benefit of this configuration is high etch rates with a lower and controlled ion energy which can improve selectivity and reduce substrate/device damage.

Plasma surface treatment systems are now being used for cleaning or etching/surface modification in a variety of electronic environments: monolithic ICs (generally formed within silicon wafer substrates), hybrid microcircuits (usually deposited "on" wafer substrates), printed circuit boards (PCBs), ball grid arrays (BGAs) and surface mounted components, component lead frames, and flat panel displays.

Examples of different types of currently-available dry etch plasma systems include: the metal etch MxP CENTURA® RIE vacuum plasma chamber distributed by Applied Materials, Inc. in Santa Clara, Calif.; Applied Materials, Inc.'s DPS inductively coupled plasma source; Applied Materials, Inc.'s AME 5000™ cluster tool; Technics Series 800 Micro™ RIE which uses RF signal to generate an RF plasma; the inductive transformer coupled plasma (TCP) planar helical coil reactor distributed by Lam Research Corporation in Milpitas, California; a helical resonator plasma source (see D. L. Smith, *Thin Film Deposition—Principles and Practice*, McGraw-Hill, Inc. New York, (1995) p. 522); a helicon plasma source (see F. F. Chen, "Helicon Plasma Sources", in High Density Plasma Sources, O. A. Popov, Editor, Noyes Publications, Park Ridge, N.J., (1995), p. 19.; or an ECR plasma source such as the MPDR 4325I™ ECR etch system distributed by Wavemat, Inc.

U.S. Pat. No. 5,693,234 issued to Peters in 1997 discloses a cup-shaped masking device 5 with a pedestal-shaped side part 5a and a cover part 5b with an aperture 6 through which there will be an incoming flow of etching gas radicals from reaction chamber 4. Reaction chamber 4 is located beyond hollow chamber 11 on the other side of aperture 6. A specific low pressure is set, which generally is so low that the mean free path length of the etching gas radicals produced in reaction chamber 4 is greater than the distance "a" from aperture 6 to substrate surface 9, and at least great enough that the etching gas radicals can traverse hollow cavity 11 to surface 9 (see Peters '234, column 4, lines 60–65). The gas radicals create, during the dry etching process disclosed by Peters, a recess 10 in substrate 9 with a depth contour t(r) that corresponds, to the deflection of a membrane (see Peters '234, column 3 through top of column 4). In the embodiments disclosed in Peters '234, etching of recess 10 requires the availability of etching gas radicals in reaction chamber 4 (located in the large space set off between electrodes 30 and 31). Halogen compounds are used as the etching gas (Peters continues in col. 4) because of the high reactivity of halogen radicals, especially fluorine and chlorine radicals. Masking device 5 is generally placed on substrate 8 as a whole before substrate 8 is introduced into receptacle 2. Typical dimensions for recess 10 (Peters '234 column 5) are 10 $\mu$m to 1 mm across ($r_0$, $r_1$ or R) and 5 $\mu$m maximum depth ($t_0$).

U.S. Pat. No. 5,372,674 issued to Steinberg discloses an electrode 11 used in a plasma assisted chemical etching process having a cylindrical inner member 47 surrounded by a cylindrical outer member 45 defining an annular cylindrically-shaped gap 77 through which gas flows so that plasma discharge 43 comes into contact with top surface 48 of substrate 25 to etch a footprint 83 therein. A substantially horizontal chimney member 35, having a centrally located aperture 39, is mounted adjacent the bottom of electrode 71. Plasma discharge 43 forms between electrode 11 and substrate 25. Therefore, a top surface 48 of substrate 25 is in contact with plasma discharge 43 and is subject to a low energy ionic flux of less than 10 eV (see column 3, lines 2242).

U.S. Pat. No. 5,627,105 issued to Delfino et al. discloses a process for making VIA interconnects on a partially processed semiconductor IC wafer (see, col. 6, line 56 through col 7, line 31). Delfino illustrates, in schematic form in FIG. 3, a cluster tool arrangement for passing wafers back and forth for processing. Delfino describes a "typical" wafer fab cluster tool as a multichamber vacuum system in which working chambers are arranged around a central transfer chamber. Each chamber of the cluster tool disclo sed by Delfino is separated from th e central transfer chamber by a gate valve with a vacuum lock. Several processing modules such as a rapid thermal processor (RTP) reacto r 49, a pair of sputter modules 46, 47 used to deposit metallization for IC current paths, an d an electron cyclotron resonance (ECR) microwa ve pla sma apparatus (which can provide low pressure, high ion density at low ion energy), are illustrated.

U.S. Pat No. 5,667,592 (Boitnott et al.) discloses a four cluster modular wafer processing system having a wafer elevator chamber 12 for receiving a cassette 16 of wafers 18 (columns 2–3). A circular wafer handling chamber 28 has a multiple-spoke single-axis rigid-arm transfer carousel 30 that oscillates to transfer wafers 18 between a set of four processing station positions 31–34. Cylindrical metal sleeves 46–49 are lowered to allow the transfer of wafers 18 between adjacent processing stations 31–34 and raised and sealed to allow wafers 18 to be exposed to a particular removable process module top (39–42).

U.S. Pat. No. 5,567,255 issued to Steinberg discloses an inert outer chimney 13 disposed against a face of an annular electrode 11. Outer and inner chimneys 13, 14 confine the gas discharge from the annular electrode 11. The process gas 23 is introduced into annular electrode 11 at the center thereof without causing any secondary discharge, such as at inlet 19 where gas 23 enters bolt 15 from housing 12 (col. 3, lines 48–52). The etching footprint of the annular electrode 1 is a two inch outer diameter and a one inch inner diameter annulus.

In an effort to control the dry etching of a substrate layer of an IC wafer, the novel confinement device, associated system for dry etching, and method for selectively etching an identified localized area in a substrate, as contemplated and described herein, are designed for efficient selective etching through one or more layers to remove unwanted material (such as silicon, silicon-oxides, silicon nitride, and/or layered metals) without damaging or unnecessarily disturbing nearby wafer real estate and associated microcircuits and micro-components. The device, system, and method of the invention may replace costly photo etch steps currently used to clear-out alignment markers and other intended distinctive topographical features and can accommodate many different wafer sizes, many different substrate topographies, and many different etchant gases.

The new device, system, and method described herein, are suitable in operation with a wide range of standard wafer processing plasmas currently used in, and under development for, dry etching to remove unwanted materials from wafer substrate surfaces. This innovative device, system, and method are suitable for use within plasma chambers incorporated as part of an integrated cluster tool platform, or as a stand-alone unit. Furthermore, the simple, yet effective, design of this new device and system allow it to be tailored-to and installed with relative ease into currently-available plasma chambers.

Unlike the dry etch plasma systems currently available, the innovative device, system, and method of the invention utilize the so-called "hollow cathode effect". None of the currently-available systems take full advantage of the relationship between plasma density, ion flux, and sheath thickness of a plasma, to selectively etch one or more substrate layers of a wafer while at the same time provide sufficient protection from disturbing nearby wafer real estate and any associated microcircuits and micro- components. In the spirit of this design, one, two, three apertures, and so on, can be added through the lower surface of the device of the invention and positioned as desired to selectively etch corresponding localized dielectric or metal areas in an underlying substrate layer(s), as will be further appreciated.

SUMMARY OF THE INVENTION

It is a primary object of this invention to provide a confinement device for operative arrangement within a substrate etching chamber. The new device has a lower surface with an aperture therethrough in communication with a channel in which etchant reactants/radicals generated by a RF or microwave plasma are confined using the hollow cathode effect for reaction to selectively etch a localized area in a substrate outer top surface generally below the aperture. A lower surface of the device is arranged over a substrate outer top surface creating a spacing therebetween. It is another object of this invention to provide a system for dry etching an IC wafer having a substrate etching chamber in which the device is operatively arranged. It is a further object to provide a method for selectively etching a localized area (which may be a pre-defined alignment mark) in a wafer substrate outer top surface in which a lower surface, having an aperture therethrough, of a plasma confinement device is arranged over the substrate outer top surface so as to leave a desired space therebetween.

The advantages of providing the new confinement device, system, and method of the invention, are as follows: (a) The costly, time-consuming photo etch steps currently used to clear-out alignment markers (there are generally two such markers in each wafer for proper alignment in the x - and y-directions) and other intended distinctive topographical features during wafer fabrication, may be replaced by utilizing the device, system, and method of the invention; (b) It is desirable that any new marker-clear-out process be capable of incorporation into existing wafer fab systems, if desired, without substantial modification to, or redesign of, existing process steps or machinery—the device, system, and method of the invention provide a means for doing just that; (c) Providing an efficient and more-effective means for etching localized areas of a wafer, that can replace the very time consuming photo etch process marker-clear-out steps currently used, reduces overall wafer fab cost; (d) Device design flexibility—additional apertures can be added to effectively etch, in parallel, additional identified localized areas, and the invention can accommodate many different wafer sizes, many different substrate topographies, and many different etchants; (e) Device/system design simplicity—the invention can be built using existing techniques for machining, assembly, bonding, and so on; and (f) Versatility—the invention is suitable for use in operation with a wide range of standard wafer processing plasmas currently used to remove unwanted materials from wafer substrate surfaces, and the invention is suitable for use as part of an integrated cluster tool platform, or as a stand-alone etching unit.

Briefly described, the invention includes a confinement device for operative arrangement within a substrate etching chamber, having a lower surface of the device generally arranged over a substrate outer top surface such that a spacing therebetween is generally equidistant. This gap-spacing is preferably no-greater-than the plasma sheath thickness to suppress plasma formation over other portions of the substrate top surface within this gap-spacing. The aperture of the confinement device is in communication with a channel in which plasma generated etchant reactants/radicals (etchant gas) can be confined for reaction to selectively etch a localized area in a substrate outer top surface located generally below the aperture. The substrate outer top surface can be generally planar, or have a curvature or other contour. The device may be in contact with a perimeter of the substrate outer top surface, be in contact with some other portion of the top surface, or not in contact with the substrate outer top surface so that the spacing covers the whole of the substrate outer top surface. The device can have additional apertures in communication with respective channels, for selective etching of additional localized areas. The channel walls can be vertical, tapered, and so on. Apertures can have many shapes (circular, oval, rectangular, etc.).

Also characterized herein, is a system for dry etching an IC wafer comprising a substrate etching chamber and a confinement device of the invention. The etchant gas within a channel of the device may take the form of a plasma induced and sustained by RF energy, a microwave source, or other source, as designed. The perimeter of the substrate outer top surface may be clamped to a wafer support member, or a chuck might be used as a wafer support (whether the chuck is in electrical connection with an RF source or capacitively-coupled to ground). The device can be made of: a unitary piece of machined, or otherwise fabricated, metal or piece of substantially-dielectric material; a substantially dielectric material with channels having a conductive liner; a substantially dielectric material with the lower surface made of a conductive material; and so on.

Also characterized, is a method for selectively etching a localized area in a wafer substrate outer top surface. One method, as characterized, has the steps of: arranging a lower surface of a confinement device over the substrate outer top surface, leaving a gap-spacing therebetween so that an aperture through the lower surface is located generally above the localized area; and providing an etchant gas to a channel in the device that is in communication with the aperture. This spacing is preferably much less than an inner width of the aperture so that a hollow cathode discharge can occur within the channel while being suppressed over other portions of the substrate top surface within this gap-spacing. Another method, as characterized, has features that further distinguish the invention from known dry etching systems and methods: arranging a lower surface of a confinement device over the outer top surface, leaving a spacing therebetween that covers at least an area of the outer top surface on which microcircuits are fabricated. In this method characterization, the spacing is generally less than a sheath thickness of the etchant gas reacting within a channel of the device/electrode (to essentially suppress plasma formation over other portions of the substrate top surface).

Additional, further distinguishing features of the methods as characterized, include: positioning the device such that the spacing is between 24 microns and 1001 microns (or, to half that much, 501 microns) and covers the whole of the outer top surface; positioning a second aperture through the lower surface above a second identified localized area in the outer top surface; positioning an IC wafer onto a mechanically clamped or electrostatic chuck (whether capacitively-coupled to an RF source or ground) for support under a counter-electrode; and positioning the device such that the spacing is generally equidistant and greater than the largest expected contaminant particle that may be within the spacing.

The confinement device for use in the method of the invention may also be machined, or otherwise fabricated, of a metal or substantially dielectric material. As further explained, the localized area being etched using the device, system, or method of the invention may be of many different materials such as: silicon, a silicon-oxide, and silicon-nitride; or of a metal selected from the group including titanium (Ti), titanium- nitride (TiN), aluminum (Al), copper (Cu), tungsten (W), tantalum (Ta), tantalum-nitride (TaN), molybdenum (Mo), niobium (Nb), and so on.

BRIEF DESCRIPTION OF THE DRAWINGS

The invention will be more particularly described by referencing the accompanying drawings of the preferred embodiments, in which like numerals designate like parts.

FIG. 1 is a schematic depicting a preferred system and method of the invention including a sectional view of a preferred device to illustrate its details.

FIG. 2 is a sectional view, similar to that of FIG. 1, of an alternative device of the invention 42 arranged above wafer 50 and mechanically clamping it to a chuck 64 with a contoured top surface 65, causing an outer top surface 52 of wafer 50 to bow. The lower surface 44 of device 42 is, likewise, contoured to maintain a spacing 55 that is generally equidistant except at the edge of the wafer where it is in mechanical contact with the wafer.

FIG. 3 is a schematic depicting an embodiment of the invention including a sectional view of an alternative device 12a arranged above wafer substrate 20 supported by chuck 34 (shown capacitively-coupled to ground at 33a).

FIG. 4 depicts another alternative embodiment of the invention including an inductively coupled plasma source (having a continuous coil 90 arranged over a bell-jar shaped receptacle 92), and a sectional view of alternative device 72 with three channels 76, 77, 78 arranged above localized areas 21a, 21b, 21c in the outer surface 22 of wafer substrate 20.

FIG. 5 is a bottom plan view of alternative device 72, shown sectioned in FIG. 4 along 4—4 in FIG. 5. Channels 76, 77, 78 are easily viewed in this bottom plan.

FIG. 6 illustrates another alternative embodiment of the invention including an inductively coupled TCP (Transformer Coupled Plasma) reactor having a coiled antenna 134 located above the vacuum receptacle defined, for purposes of representation, by block 130, and a sectional view of alternative device 131 (having dielectric section 132 and conductive layer 133) arranged above localized areas 21a and 21b in the outer surface 22 of wafer substrate 20 which is supported by electrostatic chuck 145.

FIG. 7 illustrates yet another alternative embodiment of the invention which may be arranged within an RIE reactor. Shown in sectional view are counter-electrode 234 positioned above alternative device 231, and substrate 20 is supported by electrostatic chuck 245 (all of which are arranged within the vacuum receptacle defined at 230).

DETAILED DESCRIPTION OF THE PREFERRED EMBODIMENTS

The preferred system 10 in FIG. 1 can be used for dry etching an integrated circuit (IC) wafer substrate. Arranged within the vacuum etching chamber (defined, schematically, by the block labeled 30) is a mechanically clamped chuck 34 for supporting wafer substrate 20, over which a lower surface 14 of preferred confinement device 12 has been positioned. At the shelf-areas identified and labeled 24 and 29 on the sectional view in FIG. 1, it is apparent that device 12 is in contact with the perimeter of substrate 20. In the event substrate 20 is an IC wafer, its perimeter will be circular as will be the contact shelf-area (24/29) of device 12.

As designed and unlike known dry etching systems and apparatuses, it is critical that gap-spacing 25 between lower surface 14 and top surface 22 of substrate 20 be such that a hollow cathode discharge can form within the channels 18 and 16 (and may extend slightly below) but will not otherwise form within the spacing 25. For this to happen, the channel diameter or lateral dimension is preferably greater than 3 times the sheath thickness, while at the same time, spacing 25 (dimensionally labeled h) is less than the sheath thickness to suppress a hollow cathode discharge therein. Thus, the plasma within the channels will, for the most part, be of a higher density than the plasma sustained within the surrounding etching chamber (represented, schematically, by block 30) resulting in a high etch rate beneath the aperture(s), while at the same time, plasma will not penetrate under the confinement device 12 within gap-spacing 25 over other portions of the substrate (so these other portions will remain un-etched). Thus, selective etching is achieved on the wafer substrate in the areas beneath the channels 18 and 16. Preferably, spacing 25 is less than $\frac{1}{3}^{rd}$ (and even less than $\frac{1}{5}^{th}$) the size of the smallest diameter of aperture 26 and 28 of channels 16 and 18, respectively. The inner walls 17, 19 of channels 16, 18 are vertical although, as pointed out in connection with other FIGS., channel inner walls need not be vertical but may be tapered (see FIG. 3 at 17a, 19a), arched, and so on. The device 12 can be machined, or otherwise fabricated, of 30 metal or a dielectric. The walls of the etching chamber (schematically at 30) can be made of a dielectric or metal as long as a means is provided to allow RF energy through the wall (yet electrically isolated therefrom) and directly to electrode/chuck 34. In practice, there may be a gap between the chamber wall and an RF electrode (such as 34) which must be filled with a dielectric to prevent RF plasma formation therein.

The confinement device 12 can be placed over substrate 20 after it has been positioned above electrode (chuck) 34 which is connected via a capacitor to high-frequency generator 35 (the associated impedance matching network is not shown, for simplicity) to produce an RF plasma environment. Counter-electrode 32 and a casing for vacuum chamber 30 are illustrated at ground (33). Alternatively, chuck 34 can be connected to ground with RF power connected through a blocking capacitor to electrode 32. In practice, the wafer electrode in a plasma etching system should always be connected to a blocking capacitor that is either connected to an RF power source or ground in order to prevent direct current (DC) from passing through the wafer, which could cause device damage. RF powered and grounded electrode pairs (such as planar reactor electrodes 32, 34 shown in FIG. 1) can be made of varying suitable sizes to accommodate wafer substrates of differing sizes. The chamber defined by 30 can be supplied with a supply gas along the direction of arrow 36 through an appropriate fitting (not labeled) and evacuated along the direction of arrow 38 through an appropriate suction fitting (not labeled). As can be appreciated, the location of plasma supply to chamber 30, and evacuation thereof, is not critical in system 10.

Due to this novel design, in operation etchant gases sustained within the vacuum chamber defined by rectangle 30 in FIG. 1, will enter channels 16, 18 of confinement device 12 and, here after application of RF (or microwave) power, will generally form a higher intensity RF (or microwave) plasma within channels 16 and 18 due to the hollow cathode effect described above. As discussed above, this aids in selective etching of identified localized areas in substrate 20 generally below apertures labeled 26, 28 (as identified and shown in the substrates depicted in FIGS. 2, 3, 4, 6 and 7).

By way of example only, in an RIE system with an RF fluorine-based plasma (such as Freon 14—$CF_4$, Fluoroform—$CHF_3$, $C_2F_6$, and so on) maintained at a relatively high pressure (0.2 Torr to 2 Torr, preferably about 1 Torr), a preferred device such as that illustrated at 12 in FIG. 1 may have the following representative dimensions: apertures 26, 28 which can be circular in shape may each have an inner diameter of 1 mm to 15 mm (preferably nearer to 10 mm); spacing 25 is preferably less-than-or-equal-to 1 mm (1000 microns) but greater than the size of the largest contaminant particle found on a production wafer substrate (IC plasma scientists estimate that the largest contaminating particles found on wafers are on the order of 25 microns); and the thickness labeled "t" of the device's plate area may have a value of 2 mm to 15 mm (preferably nearer to 5 mm).

Wafer 50 in FIG. 2, is illustrated as having a substrate lower layer represented at 50*l* and a top substrate layer 50*t* with an outer surface labeled 52 (shown with a slight curvature). The lower layer 50*l* may be comprised of several layers deposited or formed during wafer fab process steps prior to the dry etching step using device 42. Top substrate layer 50*t* has a slight bow to it as does the top surface of the mechanical chuck. This bow equals the wafer bow caused by maximum expected helium backside pressure and it prevents the wafer from pulling away from the chuck as helium pressure is applied to the back surface of the wafer to improve heat transfer between the wafer and chuck. In FIG. 2, the lower surface 44 of device 42 has been contoured to maintain a spacing 55 between lower surface 44 and outer top surface 52 that is generally equidistant. And wafer 50 is illustrated supported by a chuck 64 (here, powered by RF generator 35) which has an upper surface, likewise, contoured. Spacing 55 is preferably no-greater-than the plasma sheath thickness and no-greater-than either of the diameters of apertures 56, 58 (which are illustrated, here, as being roughly equal, although they need not be). Etchant gas enters channels 46, 48 (each with an inner-wall 47, 49 that is vertical, although an inner-wall may be oriented/shaped in a variety of other suitable, novel ways) along arrows 46*p*, 48*p* for reaction therewithin to selectively etch respective localized etched areas labeled 57 and 53 (shown generally below respective apertures 56 and 58). Although not critical, shelf-area 59 (here, it's ring-shaped) of device 42 is in contact with the perimeter of substrate top layer 50*t*. If spacing 55 has been appropriately maintained as contemplated hereby, the selective etching of localized areas 57, 53 with device 42 will be driven by the high density plasma etchants forming/reacting within channels 46, 48.

As mentioned earlier, dielectric and/or metal CMP causes wafer alignment marks/recesses, or other distinctive topography, created earlier in the wafer fabrication process to lose their desirable distinctive topography so that underlying marks/recesses are no longer visible to the alignment sensors in the lithography tools used during subsequent photolithography steps. IC wafers typically have at least two alignment marks for proper alignment in the x- and y-directions. Since wafer misalignment can become a serious problem in wafer processing, redefinition of alignment marks is necessary for proper wafer alignment in subsequent wafer fabrication steps. Etched areas 57, 53 may be alignment marks, or other distinctive topography, which prior to being cleared-out using the device, system, or method of the invention, were earlier, planarized. Dry etching a wafer substrate outer top surface (or surfaces, if more than one layer of material needs removal) using a device of the invention, timed accordingly, can result in removal of the unwanted material(s) above alignment marks positioned below apertures 46 and 48 in order to clear-out the marks to recover desirable distinctive topography of the alignment marks for successful alignment in subsequent photolithography steps.

The etchant gas used in a system or method of the invention must be chosen for its effectiveness in etching the particular material being removed as well as the layer of material that will remain located immediately under the layer being etched. This choice may be based upon well known research concerning the reactions between available etchants, and plasmas formed therefrom, and the materials intended to be removed from a substrate surface. The flexibility of the device, system, and method of the invention is evident. For example: to etch solid Si, $SiO_2$, $Si_3N_4$, and tantalum-nitride (TaN) one could use fluorine-based etch gases $CF_4$, $SF_6$, or $NF_3$; to etch silicon (Si) one could use the chlorine-based etch gases $Cl_2$ or $CCl_2F_2$; to etch aluminum (Al) one could use chlorine-based etch gases $BCl_3$, $CCl_4$, or $Cl_2$; to etch Ti or TiN barrier metals, or copper (Cu), one could use chlorine-based etch gases $BCl_3$ or $Cl_2$; and to etch refractory metals (W, Ta, Nb, Mo) one could use a fluorine-based gas ($CF_4$, $SF_6$, or $NF_3$) or chlorine gas ($Cl_2$). It may be desirable to remove more than one layer of materials (such as, for example, silicon dioxide and silicon nitride) which have planarized one or several alignment marks/recesses using the novel device, system, and method of the invention using a fluorine-based gas (such as, for example, $CF_4$, $SF_6$, or $NF_3$).

An alternative system 10*a* is illustrated in FIG. 3. The IC wafer substrate 20 has localized areas 21*b*, 21*a* positioned under apertures 26*a*, 28*a*—each localized area having been selectively etched (or, "cleared-out", if the localized areas are alignment marks) by plasma-generated etchant reactants/radicals within tapered walled channels 16*a*, 18*a* (the tapered inner walls have been identified as 17a, 19a for reference). Also arranged within the vacuum etching chamber (defined, schematically, by the block labeled 30a) is mechanically clamped chuck 34, here shown capacitively-coupled to ground (33a), for supporting wafer substrate 20. As designed and unlike known dry etching systems and apparatuses, the spacing 25a over top surface 22 of substrate 20, is no-greater-than, and is shown here as being less-than, each of the diameters of the apertures labeled 26a, 28a of channels 16a and 18a, respectively. At the shelf-area identified as 29a on this sectional view, device 12a is in contact with the perimeter of substrate 20. In the event substrate 20 is an IC wafer, its perimeter will be circular as will be the contact shelf-area (29a) of device 12a. In FIG. 3, counter-electrode 32 is connected via a capacitor to high-frequency generator 35a. The chamber defined by 30a can be supplied with suitable etching gas along the direction of arrow 36a through an appropriate fitting (not labeled) and evacuated along the direction 38a through an appropriate suction fitting (not labeled).

The etching chamber in FIG. 4 (defined, schematically, at 92) is bell-jar shaped. Within receptacle 92, confinement device 72 has been arranged over IC wafer substrate 20 (here having multiple localized areas 21a, 21b, 21c within outer top surface 22) which is supported by mechanically clamped chuck 34 (shown, optionally as in FIG. 1, with a capacitively-coupled RF supply 35). The sectional view of plasma confinement device 72 in FIG. 4 has been taken along 4—4 of FIG. 5. Although not critical, device 72 is in contact with both chuck 34 (at shelf-area 75) and the perimeter of wafer 20 (at shelf-area 73). Illustrating the design flexibility of the instant invention, three channels have been identified at 76, 77, 78 having, respectively, varied-shaped inner-walls (one labeled, here, at 79 for reference). Here, the plasma sustained within receptacle 92 enters channels 76, 77, 78 along the direction of arrows 76p, 77p, 78p to react within respective channels and exit out apertures 86, 87, 88 for selective etching of localized etched areas 21b, 21c, 21a. It is critical that the spacing 85 between lower surface 74 and top surface 22 of substrate 20 be such that it is the plasma reacting within the channels that contributes the most to the selective etching of substrate top surface 22. As explained in connection with FIG. 1, gap-spacing 85 should be no-greater-than the plasma sheath thickness and is preferably less than $\frac{1}{3}^{rd}$ (and more-preferably less than $\frac{1}{5}^{th}$, or 20% of) the size of the inner width/diameter of the smallest aperture 86, 87, 88.

The etched areas 21a, 21b, 21c in FIG. 4 may be alignment marks, or other distinctive topography, which prior to being cleared-out using the device of the invention, were inadvertently planarized by some prior-in-sequence wafer fab operation such as CMP. The bell-jar shaped chamber defined by 92 can be supplied with etching gas along the direction of arrow 96 through an appropriate fitting perhaps from behind (not shown) and evacuated along the direction 94 through a fitting (not labeled) appropriately positioned. Here, an inductively coupled RF plasma source coil 90 rests above, and outside of, vacuum chamber 92 on a dielectric dome structure. Although not labeled, coil 90 is customarily grounded and RF powered as illustrated.

FIG. 5 is a bottom plan view of the device 72 shown sectioned in FIG. 4. One can better appreciate the positional relationship between channels 76, 77, 78 and shelf-areas 73 and 75. Although illustrated as in-line, channels 76, 77, 78 need not be. The channels will be positioned in device 72 appropriately in relation to corresponding localized areas requiring etch. Apertures, such as those shown at 86, 88, 77d may be diamond-shaped, rectangular, oval in shape, and so on, to effect the desired etch (or marker clear-out) shape. Here, the lower surface 74 of confinement device 72 is shaped in a circle to match the perimeter of a standard silicon wafer with which it will be in contact during the etching operation. In the event a wafer or substrate is otherwise shaped, as might be dictated by IC layout design engineers, device lower surface 74 would be correspondingly shaped to accommodate and maintain requisite spacing (85) over substrate top surface 22 (in FIG. 4).

The preferred and alternative devices illustrated in FIGS. 1–5 may be machined, or otherwise fabricated, from suitable metals such as aluminum, titanium and tungsten or dielectric materials including $SiO_2$, $Al_2O_3$, $Si_2N_3$, Si, and SiC using known precision techniques for machining. It is preferable to avoid using metal-alloys containing iron (Fe) or copper (Cu) due to the potential for contamination, or creating some other type of nuisance, within the vacuum chamber environment during dry etching. Additionally, the new device, system, and method contemplated hereby is readily adaptable in an integrated cluster tool platform similar to that disclosed in 1995 product literature accompanying Applied Materials, Inc.'s metal etch MxP CENTURA™ RIE plasma system.

Turning, together, to the novel versatile dry etching approaches of the invention depicted in both FIGS. 6 and 7, neither of the illustrated alternative device embodiments (labeled 131 and 231) contact any part of the outer top surface 22 of substrate 20.Instead, depending upon where channels 160, 180, 260, 280 are located within respective devices 131, 231, the whole of outer top surface 22 is conveniently available for etching of identified localized areas 21a and 21b. Furthermore, in both alternative embodiments of the invention, substrate 20 can be supported by an electrostatic chuck 145 (FIG. 6) or 245 (FIG. 7) which is shown RF powered by a generator/impedance matching network represented collectively at 147 (FIG. 6) and at 247 (FIG. 7).

Each of alternative confinement devices 131 and 231 has a substantially non-conductive dielectric component 132, 232 (suitable dielectric materials include $SiO_2$, $Al_2O_3$, Si and SiC) to which a conductive layer or lining 133, 233a, 233b has been added (suitable conductive materials include metals such as aluminum, titanium and tungsten, preferably avoiding the use of metal-alloys containing iron or copper). By way of review, as is well known, a "perfect" dielectric is a material for which its conductivity is zero: It cannot furnish free charges and is considered non-conductive. In operation, the devices shown in FIGS. 6 and 7 at 131, 231 each have an etchant reaction channels 160, 180, 260, 280. Etchant gas enters through an entry port located at the side (FIG. 6) or top (FIG. 7) for reaction within the channels and selective etching of areas 21b, 21a in substrate top surface 22 below respective apertures (labeled 126, 128, 226, 228). The etchant gas reacting within the channels will, for the most part, be of a higher density than any plasma sustained within the surrounding etching chamber (such as that defined, schematically, at 130, 230). It is preferred that the etchant gas reacting within the channels, contribute the most to the selective etching of substrate top surface 22. Here, as explained above and unlike known dry etching systems, the gap-spacing (labeled 125 in FIG. 6 and 225 in FIG. 7) between lower surfaces 140 and 240, respectively, and substrate top surface 22 is no-greater-than the plasma sheath thickness and will be less than the inner diameter of each of the apertures (labeled 126, 128, 226, 228). Preferably, each of the inner diameters of the apertures is at least 5 times greater than respective gap-spacing (125, 225).

Furthermore, as illustrated in FIGS. 6 and 7, and unlike known dry etching systems, channels 160, 180, 260, 280 have been machined or bored having vertical inner-walls (167, 189, as labeled for reference in FIG. 6) through dielectric components 132, 232. The alternative system 100 in FIG. 6, particularly, has closed passageways (represented, schematically, at 137*a* and 137*b*) for transport of supply gas along direction arrows 136*a*, 136*b* from a downstream supply gas source located outside vacuum chamber 130. The passageways 137*a*, 137*b* allow gas to flow into channels 160, 180 for high density RF plasma formation to selectively etch areas identified at 21*a*, 21*b* (which could be alignment marks needing clear-out of silicon, silicon-oxides, silicon nitride, a metal, and so on) using the spiraled coils of an inductive coupling (TCP) antenna 134. Antenna 134 is illustrated connected to suitable RF power circuitry 135 and to ground at 139. A thin conductive layer/surface (represented at 133) has been added to device (collectively labeled 131) to reduce the chance of inductive coupling of RF energy into the wafer substrate 20. The etchant gas can exit vacuum chamber 130 of system 100 along direction arrow 138 through an appropriate fitting (not labeled).

Now, turning to FIG. 7, this implementation of a novel alternate system 200 and associated method of the invention uses an RIE reactor (thus, utilizing RF plasma) and device 231 to etch top surface 22 of substrate 20 at localized areas 21*a*, 21*b* (which could be alignment marks needing clear-out of silicon dioxide, silicon nitride, a metal, and so on). Etchant supply gas is transported along direction arrow 236 into and along a closed passageway 237 through counter-electrode 234 and into channels 260, 280 through dielectric component 232 of confinement device 231. Channels 260, 280 have been partially lined with conductive material 233*a*–*b* (shown in electrical communication with counter-electrode 234) for high intensity reaction such as the formation of a plasma having a higher density than that sustained within the vacuum chamber defined by block 230. Etchant gas flow can exit chamber 230 of system 200 along direction 238 through an appropriate fitting (not labeled).

Specific novel features and steps of the method of the invention, as characterized herein, are readily ascertainable from this detailed disclosure, including the seven FIGS. as labeled and described.

While certain representative embodiments and details have been shown for the purpose of illustrating the invention, those skilled in the art will readily appreciate that various modifications may be made to the invention without departing from the novel teachings or scope of this invention. Accordingly, all such modifications are intended to be included within the scope of this invention as defined in the following claims. In the claims, any means-plus-function clauses used are intended to cover the structures described herein as performing the recited function and not only structural equivalents but also equivalent structures.

What is claimed is:

1. A confinement device for operative arrangement within a substrate etching chamber, comprising:

a lower surface of the device generally arranged over a substrate outer top surface such that a spacing therebetween is generally equidistant and said lower surface above said spacing is not in contact with said substrate outer top surface;

said spacing being less-than one-half of an inner width of an aperture through said lower surface; and said aperture in communication with a channel in which an etchant gas is confined for reaction to selectively etch a localized area in said substrate outer top surface generally below said aperture.

2. The device of claim 1 wherein said substrate outer top surface is generally planar, around said spacing is a shelf-area of the device in contact with said substrate outer top surface, and said localized area in said substrate outer top surface is over a prior-defined recess.

3. The device of claim 2 wherein said spacing is between 24 microns and 100 1 microns and is positioned over an area on which microcircuits are fabricated, the substrate etching chamber comprises a vacuum chamber into which the device can be operatively arranged, and said reaction in said channel comprises formation of a plasma of a higher intensity than that forming outside said channel and within said vacuum chamber.

4. The device of claim 1 wherein said device lower surface is contoured, said aperture is generally circular, an inner-wall of said channel is generally vertical, and said inner width has a value that is at least three times greater than said spacing.

5. The device of claim 1 wherein said aperture is generally circular, an inner wall of said channel is generally tapered, said localized area in said substrate outer top surface is of silicon-oxide, and said spacing is less than one-fourth of said inner width value.

6. The device of claim 1 wherein the device is in contact with a perimeter of said substrate outer top surface so that said spacing covers an area on which microcircuits are fabricated, said reaction comprises formation of a plasma, said spacing is less than a sheath thickness of said plasma and a hollow cathode discharge thereof is generally suppressed from within said spacing, and said localized area in said substrate outer top surface is of a material selected from the group consisting of silicon, silicon-oxide, and silicon-nitride.

7. The device of claim 1 wherein said spacing covers the whole of said substrate outer top surface, said lower surface of the device is made of a dielectric material, said aperture is generally oval, and said channel has a conductive liner extending at least partially therealong.

8. The device of claim 1 wherein said reaction in said channel comprises formation of a plasma of a higher intensity than that forming outside said channels and within the substrate etching chamber, said spacing is greater than 24 microns and less than a sheath thickness of said plasma, and said device has been fabricated of a dielectric material, said lower surface of the device being made of a conductive material.

9. A confinement device for operative arrangement within a substrate etching chamber, comprising:

a lower surface of the device generally arranged over a substrate outer top surface such that a spacing therebetween is generally equidistant;

an aperture through said lower surface and in communication with a channel in which an etchant gas is confined for reaction to selectively etch a localized area in said substrate outer top surface generally below said aperture;

said channel in communication with a passageway through a substantially non- conductive component of the device, said lower surface being made of a conductive material; and said reaction in said channel comprises formation of a hollow cathode plasma discharge, said spacing is less than a sheath thickness of said plasma, and said localized area in said substrate outer top surface is of a metal selected from the group consisting of titanium (Ti), titanium-nitride (TiN), aluminum (Al), copper (Cu), tungsten (W), tantalum (Ta), tantalum-nitride (Ta), molybdenum (Mo), and niobium (Nb).

10. A confinement device for operative arrangement within a substrate etching chamber, comprising:

a lower surface of the device generally arranged over a substrate outer top surface such that a spacing therebetween is generally equidistant;

said spacing being less-than one-half of an inner width of an aperture through said lower surface;

said aperture in communication with a first channel in which an etchant gas is confined for reaction to selectively etch a localized area in said substrate outer top surface generally below said aperture;

a second aperture through said lower surface, said second aperture in communication with a second channel in which said etchant gas is also confined for reaction to selectively etch a second localized area in said substrate outer top surface generally below said second aperture; and an inner width of said second aperture is greater than three times said spacing; and said first and second channels in communication with an etchant supply gas passageway through a substantially non-conductive component of the device.

11. The device of claim 10 wherein said reaction in each of said channels comprises formation of a plasma of a higher intensity than that forming outside said channels and within the substrate etching chamber, each of said localized areas in said substrate outer top surface is of a material selected from the group consisting of silicon, silicon-oxide, and silicon-nitride located over a respective prior-defined recess.

12. The device of claim 10 wherein the inner walls of said channels are generally tapered, said inner width of said apertures being smaller than an inner diameter of a corresponding entry port of each of said channels, and said localized area in said substrate outer top surface is of a metal selected from the group consisting of titanium (Ti), titanium-nitride (TiN), aluminum (Al), copper (Cu), tungsten (W), tantalum (Ta), tantalum-nitride (TaN), molybdenum (Mo), and niobium (Nb).

13. A system for dry etching an integrated circuit (IC) wafer comprising a confinement device placed within a substrate etching chamber, the system comprising:

the device comprising: a lower surface of the device generally arranged over a substrate outer top surface such that a spacing therebetween is generally equidistant; said spacing being less-than one-half of an inner width of an aperture through said lower surface; around said spacing is a shelf-area of the device in contact with said substrate outer top surface; and said aperture in communication with a channel in which an etchant gas is confined for reaction to selectively etch a localized area in said substrate outer top surface generally below said aperture; and using radio-frequency (RF) energy a hollow cathode RF plasma discharge is induced and sustained within said channel.

14. The system of claim 13 further comprising a chuck for supporting the IC wafer, said chuck having a contoured top surface and in electrical connection with a capacitive element, and a counter-electrode positioned above the device; and wherein the device has been machined of a metal.

15. A system for dry etching an integrated circuit (IC) wafer, comprising:

a substrate etching chamber having a remote microwave etchant gas cavity and a passageway for flow of said etchant gas to the device of claim 1; and the device wherein said spacing is between 24 microns and 501 microns and a hollow cathode discharge is generally suppressed from within said spacing, the device is in contact with a perimeter of said substrate outer top surface, and said perimeter is clamped to a wafer support member.

16. A system for dry etching an integrated circuit (IC) wafer, comprising:

the device of claim 1 placed within the substrate etching chamber using radio-frequency (RF) energy to induce and sustain an RF plasma within said channel, and a counter-electrode positioned above, and in contact with, the device; and wherein the device further comprises a second aperture through said lower surface, said second aperture in communication with a second channel in which said etchant gas is also confined for reaction to selectively etch a second localized area in said substrate outer top surface generally below said second aperture, and each of said channels has a conductive liner extending at least partially therealong, said liner in electrical contact with said counter-electrode.

17. The system of claim 16 further comprising a chuck in electrical connection with a capacitive element; and wherein said spacing is between 24 microns and 1001 microns and covers the whole of said substrate outer top surface including an area on which microcircuits are fabricated, and a hollow cathode discharge is generally suppressed from within said spacing.

18. A system for dry etching an IC wafer, comprising the device of claim 1:

the substrate etching chamber comprising an inductively coupled plasma reactor, a vacuum chamber into which the device can be operatively arranged, and a chuck for supporting the IC wafer, said chuck in electrical connection with a capacitive element and a radio-frequency (RF) source; and the device of claim 1 wherein said reaction in said channel comprises formation of an RF plasma of a higher intensity than that forming outside said channel and within said vacuum chamber.

19. The system of claim 18 wherein said plasma reactor comprises an antenna, said spacing is less than a sheath thickness of said plasma, said device is in contact with a perimeter of said substrate outer top surface so that said spacing covers an area on which microcircuits are fabricated, an inner wall of said channel is generally tapered, and the device has been machined of a metal.

20. The system of claim 18 wherein said spacing covers the whole of said substrate outer top surface, an inner-wall of said channel is generally vertical and made substantially of a dielectric material, and said lower surface of the device is made of a conductive material.

21. The system of claim 18 wherein said spacing is positioned over an area on which microcircuits are fabricated, said spacing is less than a sheath thickness of said plasma, a hollow cathode discharge thereof being generally suppressed from within said spacing, and wherein the device has been fabricated of a ceramic.

22. A confinement device for operative arrangement within a substrate etching chamber, comprising:

a lower surface of the device generally arranged over a substrate outer top surface such that a spacing therebetween is generally equidistant and said lower surface above said spacing is not in contact with said substrate outer top surface;

an aperture through said lower surface and in communication with a channel in which an etchant gas is confined for reaction to selectively etch a localized area in said substrate outer top surface generally below said aperture; and said reaction comprising formation of a plasma, said spacing being less than a sheath thickness of said plasma, and an inner width of said aperture being at least three times said sheath thickness.

23. The device of claim 22 wherein said reaction further comprises inducing and sustaining a hollow cathode RF discharge, and said hollow cathode RF discharge is generally suppressed from within said spacing.

24. The device of claim 22 wherein: around said spacing is a shelf-area of the device in contact with at least a portion of a perimeter of said substrate outer top surface.

25. A confinement device for operative arrangement within a substrate etching chamber, comprising:

means for maintaining a spacing between a lower surface of the device and a substrate outer top surface such that said lower surface above said spacing is not in contact with said substrate outer top surface;

said spacing being less-than one-half of an inner width of an aperture through said lower surface; and said aperture in communication with a channel in which an etchant gas is confined for reaction to selectively etch a localized area in said substrate outer top surface generally below said aperture.

26. The device of claim 25 wherein: around said spacing is a shelf-area of the device in contact with at least a portion of said substrate outer top surface.

* * * * *